United States Patent [19]
Tieber et al.

[11] Patent Number: 6,165,232
[45] Date of Patent: Dec. 26, 2000

[54] METHOD AND APPARATUS FOR SECURELY HOLDING A SUBSTRATE DURING DICING

[75] Inventors: Alois Tieber, San Jose, Calif.; Kiyoteru Saiki, Kyoto, Japan

[73] Assignees: Towa Corporation, Kyoto, Japan; Intercon Tools, Inc., Morgan Hill, Calif.

[21] Appl. No.: 09/156,961

[22] Filed: Sep. 18, 1998

Related U.S. Application Data

[60] Provisional application No. 60/077,850, Mar. 13, 1998.

[51] Int. Cl.$^7$ ..................................................... H01L 21/00
[52] U.S. Cl. ........................... 29/25.01; 269/21; 438/460; 451/388
[58] Field of Search ..................................... 83/23, 13, 25, 83/27, 53, 78, 167, 929.1; 206/710; 269/21, 20, 903; 414/935, 939, 936; 29/25.01; 438/110, 113, 460; 451/364, 388

[56] References Cited

U.S. PATENT DOCUMENTS

| | | |
|---|---|---|
| 3,809,050 | 5/1974 | Chough et al. . |
| 3,976,288 | 8/1976 | Cuomo et al. ............................... 269/21 |
| 4,004,955 | 1/1977 | Dost et al. ............................... 438/460 |
| 4,046,985 | 9/1977 | Gates ................................... 219/121 L |
| 4,600,936 | 7/1986 | Khoury et al. .......................... 29/25.01 |
| 4,685,363 | 8/1987 | Gerber ........................................ 83/22 |
| 5,710,065 | 1/1998 | Alfaro . |
| 5,803,797 | 9/1998 | Piper ....................................... 451/182 |

*Primary Examiner*—John F. Niebling
*Assistant Examiner*—Christopher Lattin
*Attorney, Agent, or Firm*—Beyer Weaver & Thomas, LLP

[57] ABSTRACT

A nest mechanism which is arranged to support a substrate during a dicing process, and methods for using such a nest mechanism, are disclosed. According to one aspect of the present invention, a nest apparatus supports a substrate, which includes a chip, a first side, and a second side, during a dicing process, includes an alignment mechanism that positions the substrate with respect to the nest apparatus. The nest apparatus also includes a grid arrangement that defines an opening which receives a contact which is included on the second side of the substrate. In one embodiment, the alignment mechanism is an alignment pin that engages the substrate, as for example through an opening in the substrate, to hold the substrate.

22 Claims, 7 Drawing Sheets

METHOD AND APPARATUS FOR SECURELY HOLDING A SUBSTRATE DURING DICING

CROSS REFERENCE TO RELATED APPLICATION

The present invention claims priority of co-pending provisional U.S. patent application Ser. No. 60/077,850, filed Mar. 13, 1998, which is incorporated herein by reference in its entirety for all purposes.

BACKGROUND OF THE INVENTION

1. Field of Invention

The present invention relates generally to the fabrication of integrated circuits chips. More particularly, the present invention relates to a nesting apparatus that is suitable for supporting a substrate during a dicing process.

2. Background

During the fabrication of integrated circuit chips, multiple integrated circuit chips are often arranged on a single substrate, e.g., wafer or circuit board, which is eventually diced to separate the integrated circuit chips. Although a substrate may be sawed, or diced, to create individual chips at substantially any point during an overall fabrication process, the substrate is typically sawed after ball grid arrays and dies are formed on the substrate.

Figure 1A:
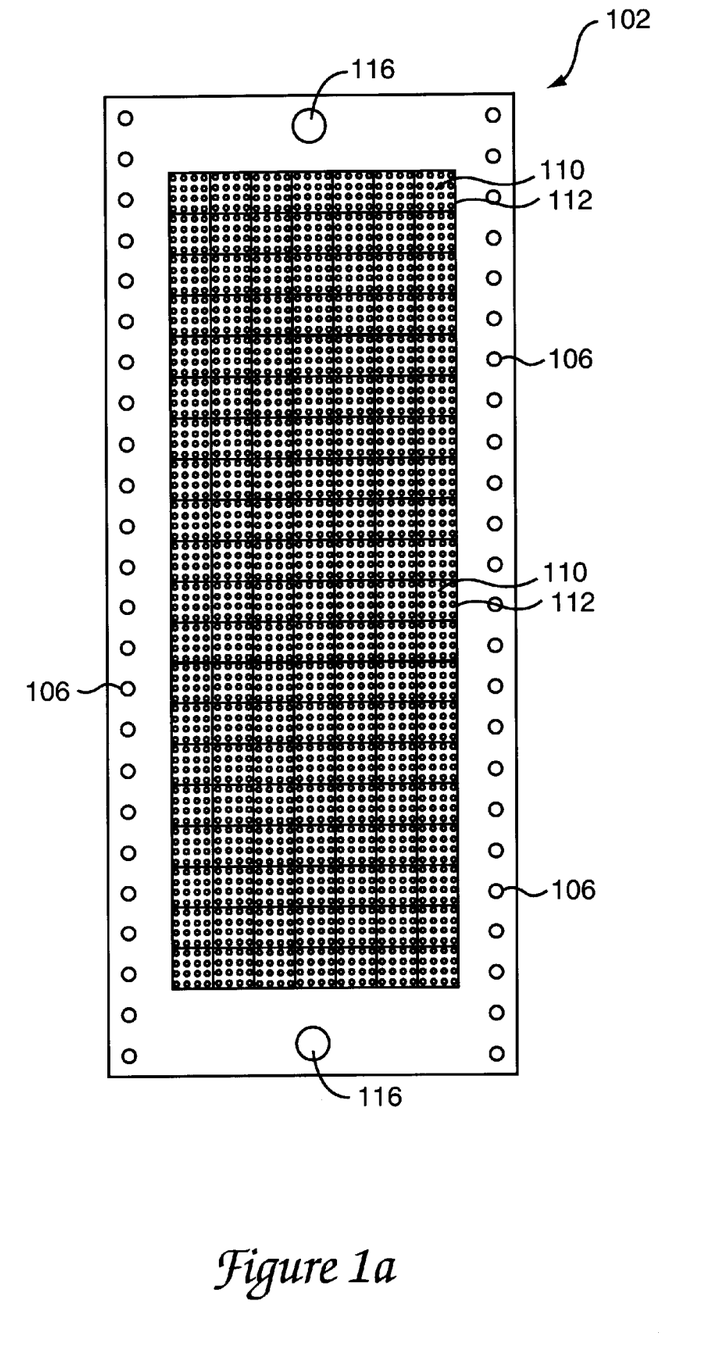
FIG. 1a is a diagrammatic representation of a ball grid array side of a conventional substrate.

FIG. 1a is a diagrammatic representation of a contact, or ball grid array (BGA) side of a conventional substrate. A substrate 102 includes individual integrated circuit chips 112, each of which includes a ball grid array 110 of contacts, as will be appreciated by those skilled in the art. In general, the number of integrated circuit chips 112 formed on substrate 102 may vary, depending upon the size of substrate 102 and the size of each integrated circuit chip 112. Further, the number of balls in each ball grid array 110 may also vary. By way of example, as shown, substrate 102 includes one hundred and forty integrated circuit chips 112, each of which have a ball grid array with sixteen balls.

Substrate 102 also generally includes locator holes 106 which are used for various fabrication processes including, but not limited to, processes used to apply ball grid arrays 110 on chips 112 and processes used to encapsulate substrate 102. "Pickup points" 116, which are also included on substrate 102, are arranged to enable cameras to check the overall alignment of substrate 102, as necessary, during fabrication.

Figure 1B:
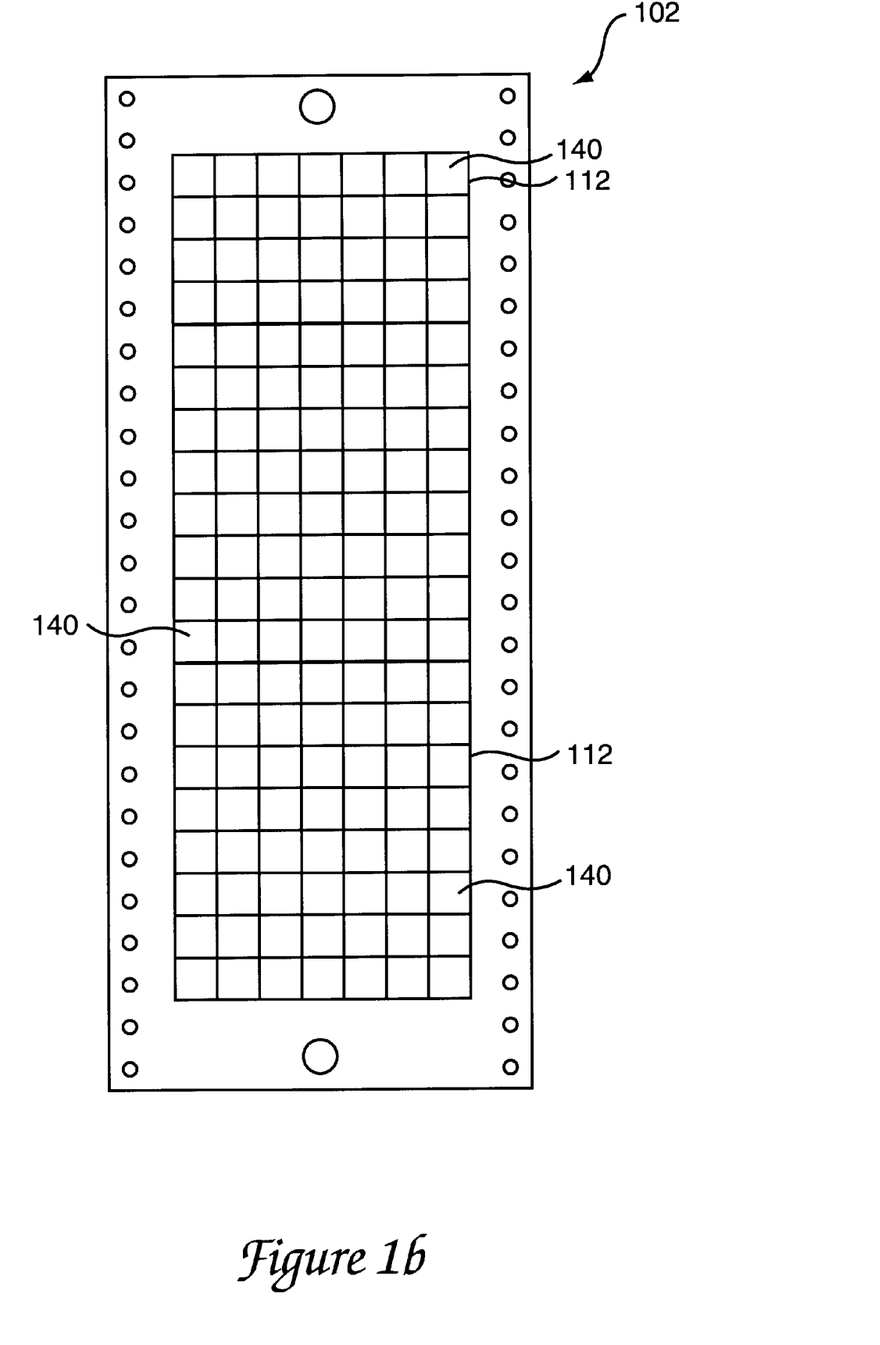

A representation of the non-BGA side of substrate 102 is shown in FIG. 1b. Non-BGA side of substrate 102 may be considered to be the "die-side" of substrate 102, as non-BGA side typically includes integrated circuit dies 140. As will be appreciated by those skilled in the art, when substrate 102 is diced to form individual integrated circuit chips 112, one side of each integrated circuit chip 112 will have ball grid array 110, while the other side will have integrated circuit due 140.

As mentioned above, in order to separate integrated circuit chips from a substrate, the substrate must be diced with a dicing saw or similar device. Typically, a dicing process involves manually placing the substrate, non-BGA side down, on an adhesive surface, e.g., tape. The tape is arranged to hold the individual integrated circuit chips in place, both during and after dicing. Specifically, the tape is used to prevent the individual integrated circuit chips from rotation and translation with respect to one another.

A substrate is cut from the BGA side, i.e., a substrate is cut with the non-BGA side down, since it is difficult for tape to effectively grip and hold the balls in ball grid arrays, either from the bottom surfaces of the balls or from the side surfaces of the balls. In other words, while tape is capable of securely holding a substantially smooth surface such as the dies on a substrate during dicing, the tape is not as effective in securely holding an uneven surface, such as the overall surface of ball grid arrays, during dicing.

Once a substrate is placed on tape with the BGA side up, the tape and the substrate are manually loaded on a vacuum chuck for dicing. In other words, the tape and the substrate are aligned on a vacuum chuck, tape-side down, such that the vacuum from the vacuum chuck effectively "grips" the tape and the board. While the tape and the substrate are held on the vacuum chuck, a dicing saw is used to automatically dice the integrated circuit chips. As will be appreciated by those skilled in the art, the dicing saw dices the substrate to form the integrated circuit chips, substantially without cutting through the tape.

Once the integrated circuit chips are separated, the chips must be removed from the tape. A vacuum is generally not used to remove the chips from the tape, since the chips are often not accurately aligned on the tape. Typically, a person may remove each chip, BGA side up, from the tape, then place each chip, BGA side down, in a holding tray which may be used to transport the chips to a subsequent fabrication process. The use of manual processes, however, is often time-consuming and inaccurate.

Alternatively, in lieu of a manual process, a pick-and-place machine may be used to remove the chips from the tape, and place the chips in holding trays. As was the case with manually removing chips from the tape, the use of pick-and-place machines is often time consuming. By way of example, a pick-and-place machine must line up each chip prior to picking that chip off the tape. In addition, pick-and-place machines are additional pieces of fabrication equipment that are generally separate from dicing machines. Therefore, an overall dicing process is likely to require an additional manual process of transporting the tape and the diced chips to the pick-and-place machine.

The use of tape in dicing processes is often undesirable as the tape may be relatively expensive, and must be disposed of once the dicing process is completed. In addition, adhesives on the tape may remain on a chip after the dicing process, thereby creating residue that may be difficult to remove. When residue is not properly removed from a chip, subsequent fabrication steps, as well as the integrity of the chip, may be compromised. The use of tape also generally requires manual handling, e.g., placing a substrate on tape. As will be appreciated by those skilled in the art, in addition to being both tedious and time consuming, manual processes often increase the likelihood that a substrate may be mishandled or become contaminated.

Hence, what is desired is a method and an apparatus for efficiently and substantially automatically dicing a substrate to form individual integrated circuit chips. In other words, what is desired is a method and an apparatus for securely holding a substrate, without the use of tape, during a dicing process.

SUMMARY OF THE INVENTION

The present invention relates to a nest mechanism which is arranged to support a substrate during a dicing process, and methods for using such a nest mechanism. According to one aspect of the present invention, a nest apparatus supports a substrate, which includes a chip, a first side, and a second side, during a dicing process, includes an alignment mechanism that positions the substrate with respect to the nest apparatus. The nest apparatus also includes a grid arrangement that defines an opening which receives a contact which is included on the second side of the substrate. In one embodiment, the alignment mechanism is an alignment pin that engages the substrate, as for example through an opening in the substrate, to hold the substrate.

In another embodiment, the second side of the substrate includes a ball grid array, wherein the contact is a part of the ball grid array, and the opening accommodates the ball grid array. In still another embodiment, the nest apparatus also includes a holding mechanism which secure the nest apparatus to a dicing apparatus that is used to cut the substrate. In such an embodiment, the holding apparatus may specifically be arranged to effectively secure the nest apparatus to a vacuum chuck associated with the dicing apparatus.

According to another aspect of the present invention, a method for cutting a substrate without using tape to hold the substrate includes retaining the substrate within a nest mechanism that holds the substrate during cutting with a second side of the substrate facing down, or into the nest mechanism. The method also includes positioning the nest mechanism on a vacuum chuck associated with a cutting mechanism that also includes a vacuum chuck and a cutting saw, and engaging the second side of the substrate through the nest mechanism against the vacuum chuck with a vacuum generated by the vacuum chuck. Finally, the substrate is cut from the first side, using the cutting saw. In one embodiment, engaging the second side against the vacuum chuck with the vacuum involves retaining a side surface of a ball in a ball grid array, which is located on the second side of the substrate, against the nest mechanism, and engaging the ball grid array with the vacuum through the nest mechanism.

In another embodiment, cutting the substrate from the first side involves separating a chip, which is defined within the substrate, from the substrate. In such an embodiment, cutting the substrate may also include constraining the separated chip from translational movement by retaining the side surface of the ball against the nest mechanism and engaging the ball grid array with the vacuum from the vacuum chuck.

In accordance with yet another aspect of the present invention, a method for cutting a substrate which has a substantially smooth side and a substantially unsmooth side includes retaining the substrate within a nest mechanism, wherein retaining the substrate includes aligning the substrate within the nest mechanism such that the substrate is substantially constrained from translational and rotational movement. The method further includes positioning the nest mechanism on a vacuum chuck, engaging the substrate through the nest mechanism against the vacuum chuck, and cutting the substrate with a cutting mechanism. In one embodiment, retaining the substrate within the nest mechanism also includes placing the substrate in the nest mechanism with the substantially unsmooth, e.g., the ball grid array side, side facing down. In another embodiment, the substrate is cut from the substantially smooth side, e.g., the die side.

These and other advantages of the present invention will become apparent upon reading the following detailed description, and studying the various figures of the drawings.

BRIEF DESCRIPTION OF THE DRAWINGS

The invention may best be understood by reference to the following description taken in conjunction with the accompanying drawings in which:

FIG. 1b is a diagrammatic representation of a die side of the conventional substrate of FIG. 1a.

DETAILED DESCRIPTION OF THE EMBODIMENTS

The present invention will now be described in detail with reference to a few preferred embodiments thereof as illustrated in the accompanying drawings. In the following description, numerous specific details are set forth in order to provide a thorough understanding of the present invention. It will be obvious, however, to one skilled in the art, that the present invention may be practiced without some or all of these specific details. In other instances, well known structures and process steps have not been described in detail in order not to unnecessarily obscure the present invention.

In accordance with one embodiment of the present invention, a nest apparatus is arranged, in conjunction with a vacuum, to securely hold a substrate during a dicing process without the use of tape. A substrate is placed, ball grid array (BGA) side down, into a nest which is then mounted on a vacuum chuck for dicing. During dicing, the nest and the vacuum effectively constrain the substrate and, subsequently, the individual chips formed by dicing the substrate, from translational and rotational movement. When the nest and the diced chips are removed from the vacuum chuck after dicing, the diced chips are essentially ready to be removed from the nest, as for example using a pick and place machine.

The use of a nest to hold a substrate during dicing, without tape, eliminates problems associated with adhesive residue left on chips by the tape, as well as issues associated with disposing of the tape. Using a nest also allows the overall dicing process to be more automated, as the need for manual processes including mounting a substrate on a vacuum chuck and removing chips from the tape may be eliminated.

Figure 2A:
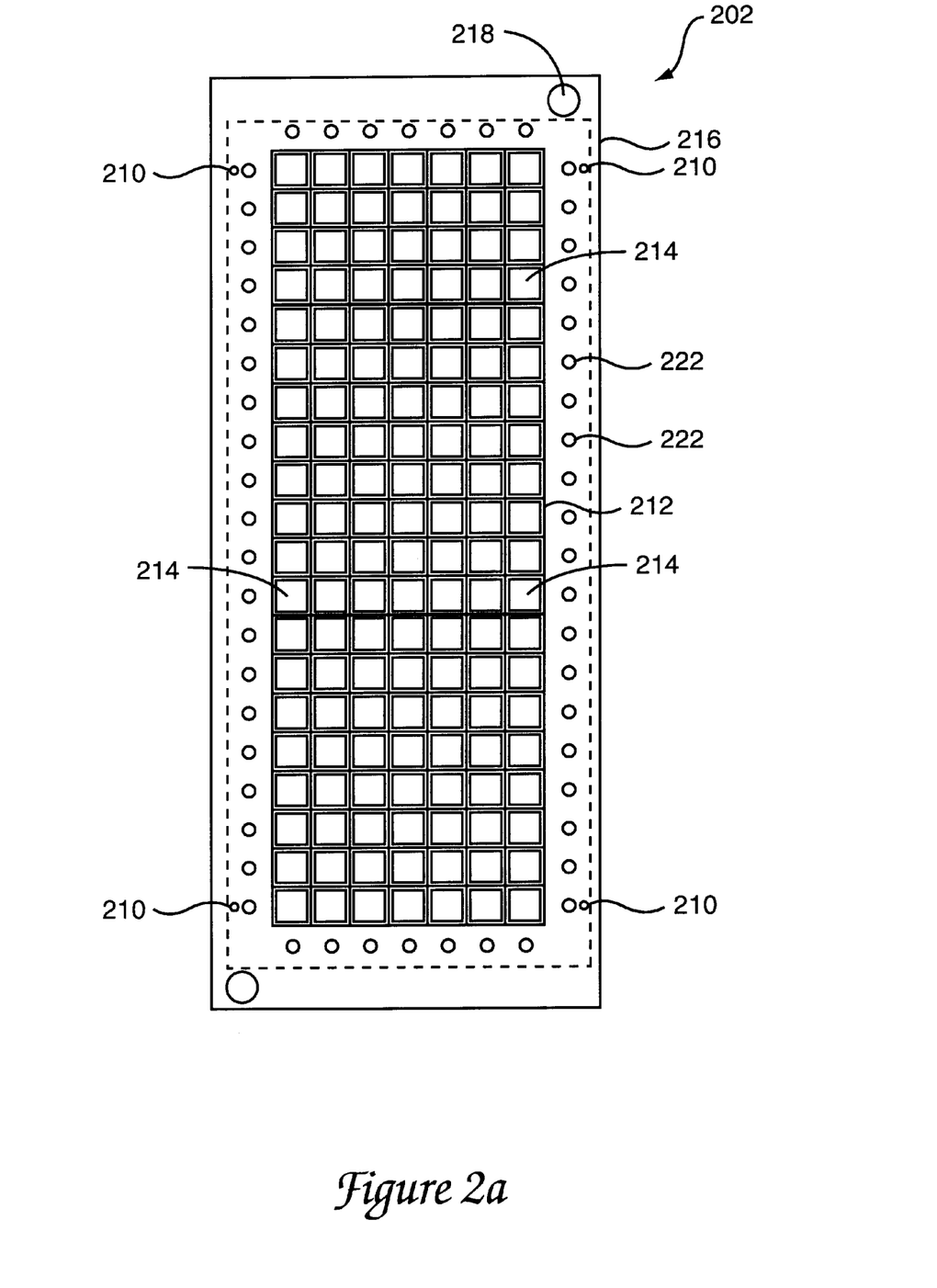
FIG. 2a is a diagrammatic top-view representation of a nest in accordance with a first embodiment of the present invention.
Figure 2B:
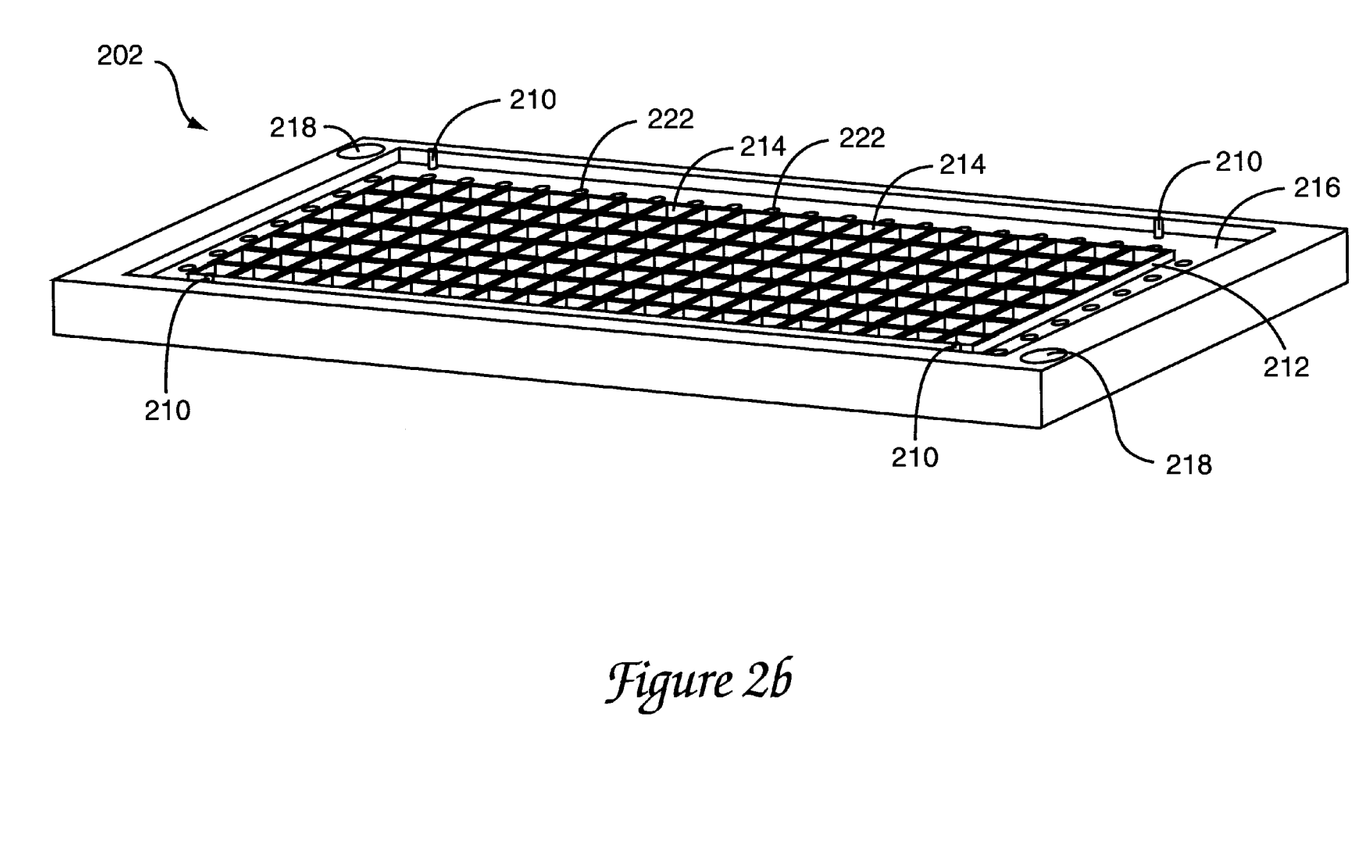
FIG. 2b is a diagrammatic perspective representation of the nest of FIG. 2a in accordance with an embodiment of the present invention.

Referring to FIGS. 2a and 2b, one embodiment of a nest mechanism will be described in accordance with the present invention. FIG. 2a is a diagrammatic top-view representation of a nest mechanism, while FIG. 2b is a substantially perspective representation of the nest mechanism. It should be appreciated that for ease of illustration, FIGS. 2a and 2b are not drawn to scale. A nest 202 is configured, or otherwise arranged, to translationally and rotationally reduce the movement of a substrate positioned within nest 202. While nest 202 may be made of a variety of different materials, in one embodiment, nest 202 is fabricated from stainless steel, due to the fact that stainless steel is both lightweight and strong. By way of example, nest 202 may be fabricated from 440C stainless. Alignment pins 210 on nest 202 are used to engage locator holes on a substrate in order to position the substrate with respect to nest 202. In general, substantially any suitable mechanism may be used to align a substrate within nest 202.

When a substrate is properly positioned with respect to nest 202, the substrate rests against a grid arrangement 212. Although the die side of a substrate may be placed "face down" on nest 202, in the described embodiment, the BGA side of the substrate is placed onto nest 202. Grid arrangement 212 defines openings 214 which accommodate the ball grid arrays of a substrate. That is, the ball grid arrays of the substrate are at least partially placed within openings 214. As shown, while grid arrangement 212 defines one hundred and forty openings 214, the number of openings 214 may typically be widely varied.

Each opening 214 effectively "holds" one ball grid array such that at least one of the balls, or contacts, of the ball grid array lightly contacts the walls of grid arrangement 212. In one embodiment, the sides of four "corner" balls of a ball grid array may contact the corners of grid arrangement 212 in each opening 214. As such, while openings 214 may be substantially rectangularly shaped, the corners of openings 214 may be slightly curved to facilitate contact of only the sides of corner balls against grid arrangement 212. It should be appreciated, however, that in some embodiments, substantially all balls along the sides of each ball grid array may contact the walls of grid arrangement 212.

Nest 202 may be mounted against a vacuum chuck that is a part of a dicing saw assembly. The vacuum chuck typically generates a vacuum which engages the substrate mounted on nest 202 through openings 214. Generally any suitable mechanism may be used to mount nest 202 against a vacuum chuck, including, but not limited to, pilot locator holes 218 which are arranged to fit over dowels, or similar structures, on the vacuum chuck.

As will be described below with respect to FIG. 3, when nest 202 and, hence, a substrate, are mounted on a vacuum chuck, a dicing saw may then cut the substrate to generate separate integrated circuit chips from the substrate. Nest 202 is effective to hold the separate integrated circuit chips substantially in place by locating the balls of the ball grid array of each chip. The vacuum from the vacuum chuck holds each chip against grid arrangement 212, while the contact between the sides of at least one of the balls of the chip and the walls of grid arrangement prevents the chip from rotating and translating. By preventing chips from rotating and translating, subsequent pick and place processes used to remove chips from nest 202 may be efficiently accomplished. Further, preventing chips from freely moving during and after dicing also reduces the likelihood that the dicing process may inaccurately cut the chips from the substrate.

In the embodiment as shown, a stepped section 216, or channeled section, is arranged to receive the cut sides of the substrate after the substrate has been cut, or diced. In other words, scrap material from the substrate falls into stepped section 216, and, as a result, is effectively prevented from migrating with respect to nest 202, and potentially negatively affecting dicing processes. Vacuum openings 222 may be used, in addition to stepped section 216, in order to further prevent scrap material from migrating during and after a dicing process. Specifically, vacuum generated by a vacuum chuck may engage the scrap material through vacuum openings 222, thereby essentially forcing the scrap material to remain within stepped section 216.

Figure 3:
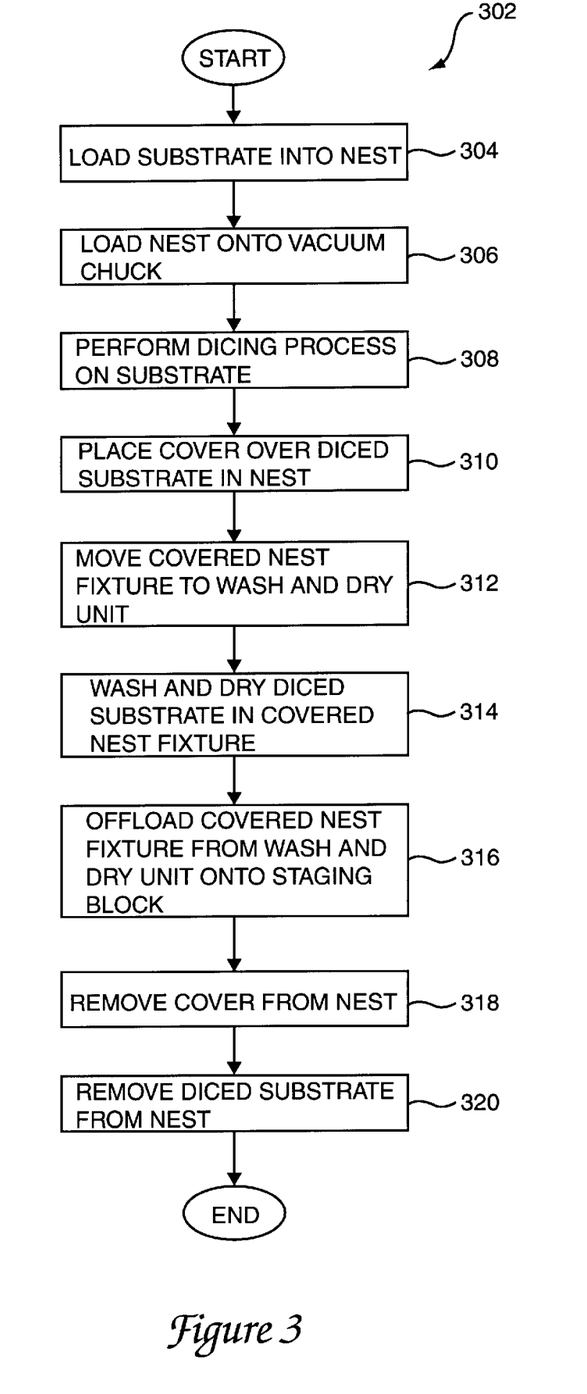
FIG. 3 is a process flow diagram which illustrates the steps associated with forming individual chips from a substrate in accordance with an embodiment of the present invention.

With reference to FIG. 3, one method of implementing the nest of FIGS. 2a and 2b in the creation of individual chips from a substrate will be described. FIG. 3 is a process flow diagram which illustrates the steps associated with forming individual chips from a substrate in accordance with an embodiment of the present invention. The process 302 begins in step 304 in which a substrate to be diced is loaded into a nest. In general, loading a substrate into a nest includes aligning the substrate with respect to the nest to properly position the substrate. In one embodiment, as described above, aligning the substrate with respect to the nest includes positioning the substrate such that alignment pins on the nest interface with locator holes on the substrate. When the substrate is properly aligned, the balls in each ball grid array located on the BGA side of the substrate are effectively positioned in the nest openings of the nest.

After the substrate is loaded into the nest in step 304, the nest is loaded onto a vacuum chuck in step 306. Specifically, the nest is automatically loaded onto the vacuum chuck such that the BGA side of the substrate is in communication with the vacuum provided by the vacuum chuck. In other words, the nest is positioned to enable the suction from the vacuum to effectively engage the BGA side of the substrate. As will be appreciated by those skilled in the art, the vacuum chuck may be a part of an overall dicing saw assembly that is arranged to dice the substrate into individual chips.

When the nest is loaded onto the vacuum chuck, then in step 308, a dicing process is performed on the substrate. In other words, the dicing saw, e.g., a diamond wheel, of the dicing saw assembly is used to cut the substrate to form individual chips. After the dicing process is completed, process flow moves to step 310 in which a cover is placed over the nest. The cover is arranged to prevent the individual chips from moving once the nest is removed from the vacuum chuck. While the configuration of the cover may vary widely, in one embodiment, the cover is arranged with protrusions which lightly press against the non-BGA side of the individual chips to hold portions of the BGA side of the individual chips against the nest. It should be appreciated, however, that the cover is generally not arranged to hold scrap material, e.g., extra material which is left at the sides of the substrate after individual chips are formed. Rather, the cover may be arranged to allow the scrap material to be washed out of the nest, as will be described below.

The covered nest fixture is removed from the vacuum chuck in step 312, and moved to a "wash and dry" unit. In one embodiment, the covered nest fixture is automatically removed from the vacuum chuck, and moved to the wash and dry unit. A wash and dry unit may be a part of the overall dicing saw apparatus, and is generally arranged to remove residue left during the dicing process from the individual chips. The wash and dry unit is further arranged to dry the chips once they have been cleaned. In general, a wash and dry unit is arranged to remove dirt, debris, and dust that has accumulated during the dicing process.

In step 314, the diced substrate is washed and dried in the covered nest fixture. During a washing process, the BGA side of the chips is effectively either sprayed with fluid, e.g., water, through the nest openings in the nest, or submerged in fluid. In addition to washing the chips, the spraying of fluid, as well as the submerging of the nest in fluid, is also effective to remove the scrap material from the nest. In other words, the scrap material is allowed to "float" out of the nest during washing, as the scrap is not held within the covered nest fixture. The wash and dry unit may be arranged to capture scrap material and residue such that the scrap material and residue may be readily removed from the wash and dry unit.

After the chips are washed and dried, the covered nest fixture is offloaded from the wash and dry unit in step 316. In one embodiment, the covered nest fixture is automatically offloaded onto a staging block. Once the covered next fixture is offloaded, then in step 318, the cover is removed, thereby exposing the diced substrate, or individual chips. Finally, in step 320, the chips are removed from the nest. Typically, the chips are removed from the nest such that they may be placed in trays for further processing. While substantially any suitable method may be used to remove the chips, methods include using a pick and place machine to remove the chips from the nest. In the described embodiment, the pick and place machine is a part of the overall dicing saw assembly. That is, a single apparatus may be used to both dice the substrate into individual integrated circuit chips and to remove the diced chips from the nest. However, it should be appreciated that the pick and place machine may, alternatively, be separate from the dicing saw assembly. When the chips are removed from the nest, the process of forming individual chips is completed.

As shown in FIG. 2a, a nest may be rectangularly shaped such that the nest is arranged to accommodate substantially rectangularly shaped substrates. In general, however, it should be appreciated that the configuration of a nest may vary widely. For example, the overall size and shape of a nest may change, depending upon the size and the shape of the substrates that the nest is intended to support. Further, the size and the shape of openings in a nest, i.e., nest openings, through which the balls on a substrate may at least partially protrude, as described above with respect to FIG. 2a, may vary depending upon the number of and orientation of balls on the substrate or, more specifically, each chip on the substrate. As such, the grids of the nest support the substrate, which are arranged to provide minimal contact on the balls as necessary to support the substrate during a dicing process, may take on different orientations.

Figure 4A:
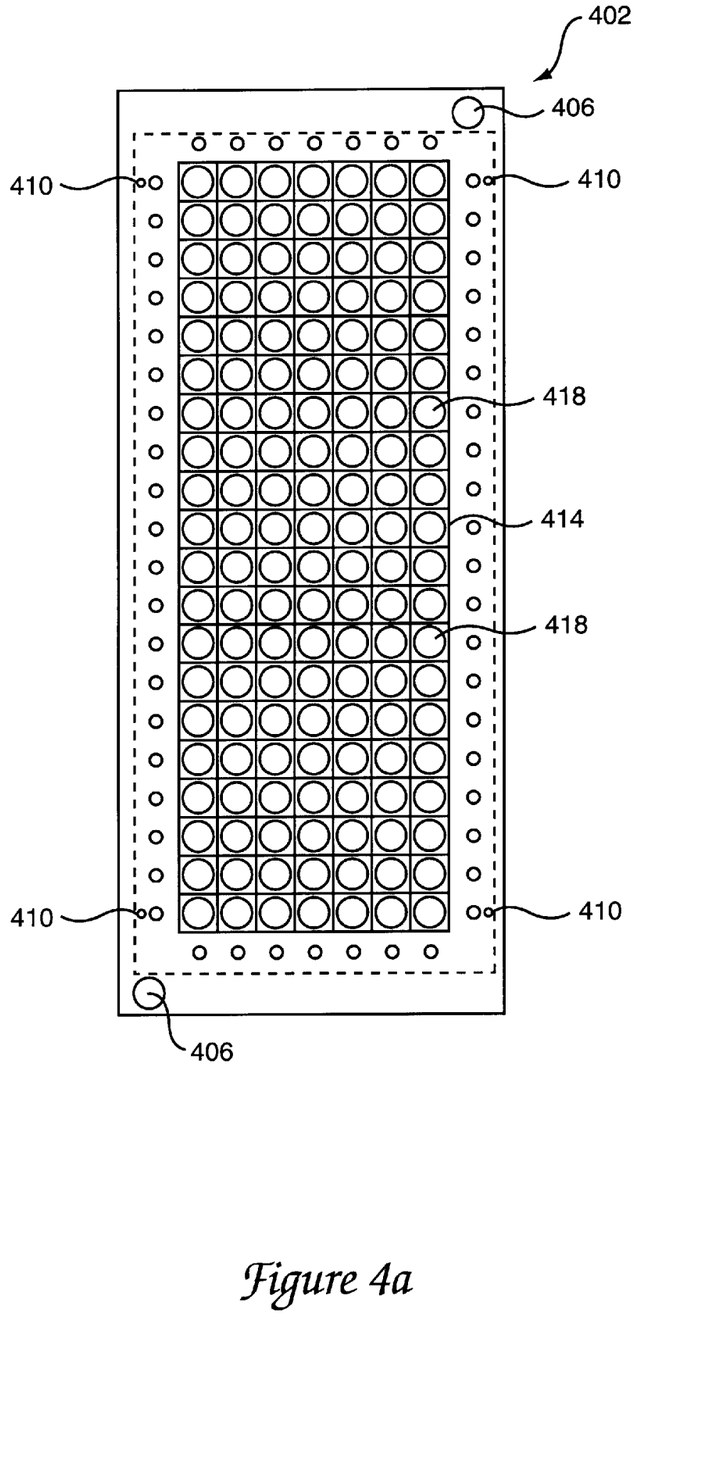
FIG. 4a is a diagrammatic top-view representation of a nest in accordance with a second embodiment of the present invention.

FIG. 4a is a diagrammatic top-view representation of a nest in accordance with a second embodiment of the present invention. Like nest 202 of FIGS. 2a and 2b, a nest 402 includes pilot locator holes 406, which may be used to hold nest 402 against a vacuum chuck. Nest 402 also includes alignment pins 410 which, as described above, are arranged to align a substrate with respect to nest 402. A grid 414 defines nest openings 418 which, in the described embodiment, are substantially circular in shape. Circularly shaped nest openings 418 may accommodate ball grid arrays which have a circular footprint. In other words, each circularly shaped nest opening 418 may be arranged to accommodate a ball grid array in which the balls are arranged in a substantially circular pattern. Alternatively, each circularly shaped nest opening 418 may be arranged to accommodate a ball grid array with a polygonal, e.g., rectangular, footprint.

Figure 4B:
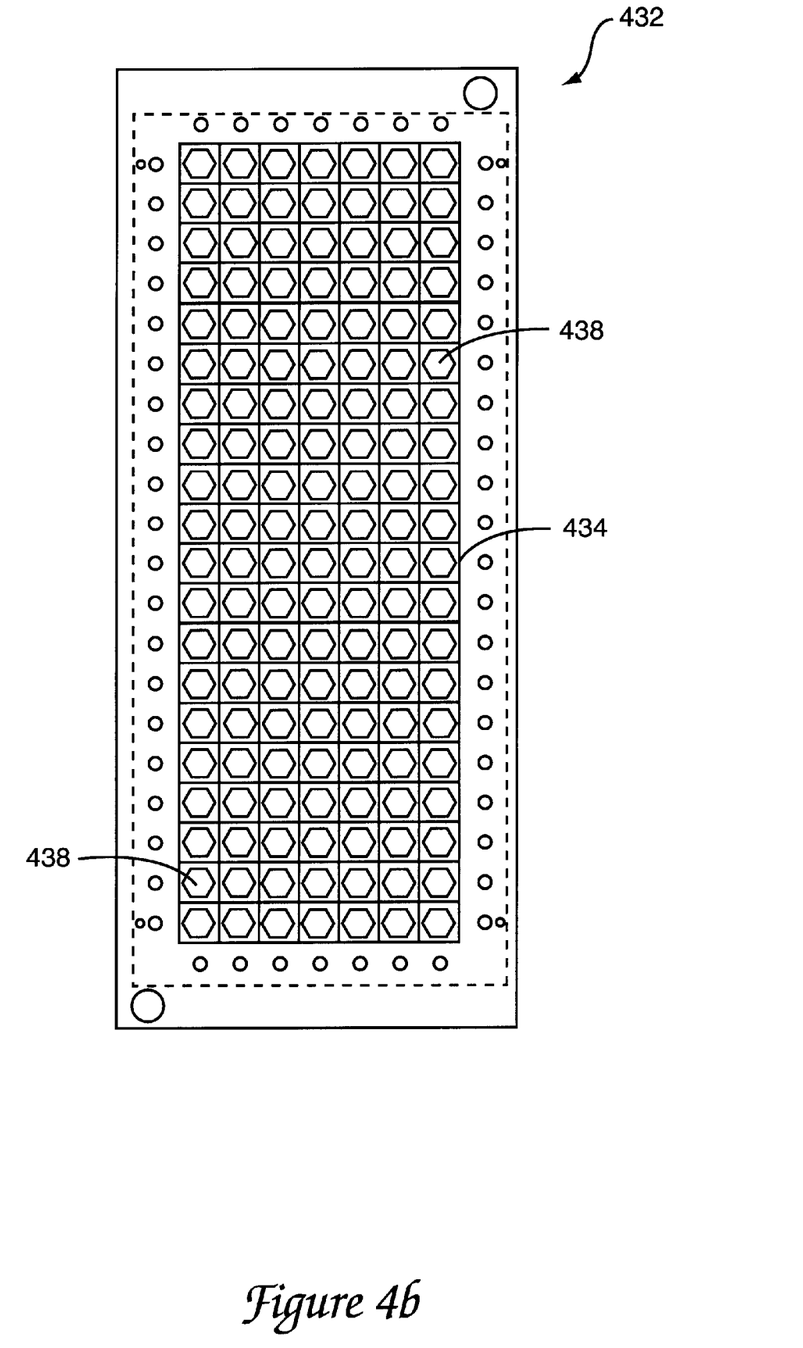
FIG. 4b is a diagrammatic top-view representation of a nest in accordance with a third embodiment of the present invention.

FIG. 4b is a diagrammatic top-view representation of a nest in accordance with a third embodiment of the present invention. A nest 432 includes a grid 434 that effectively defines nest openings 438. As shown, nest openings 438 are polygonal in shape. Specifically, in the described embodiment, nest openings 438 are hexagonal in shape. However, it should be appreciated that nest openings 438 may generally take any suitable polygonal shape.

Nest openings 438 are arranged such that they may accommodate ball grid arrays which have a footprint which is of substantially the same shape as nest openings 438. It should be appreciated, however, that nest openings 438 may be suitable for accommodating ball grid arrays which have a different footprint than that of nest openings 438. For example, hexagonally shaped nest openings 438 may accommodate ball grid arrays which are arranged in a substantially rectangular orientation. Alternatively, hexagonally shaped nest openings 438 may also accommodate ball grid arrays which are shaped in a substantially triangular orientation.

Although only a few embodiments of the present invention have been described, it should be understood that the present invention may be embodied in many other specific forms without departing from the spirit or the scope of the present invention. By way of example, while nest openings have been described as being completely open, i.e., nest openings allow substantially all balls in ball grid arrays to be exposed, nest openings may instead be only partially open. A partially open nest opening may be such that only some of the balls in a ball grid array are effectively directly exposed to a vacuum, while others are shielded from direct exposure to the vacuum. The use of partially open nest openings may be effective in allowing a substrate to be securely held by a vacuum during dicing. However, wash and dry processes used to remove residue from diced integrated circuit chips may become more complicated in that removal of residue from around the balls may be difficult when not all of the balls are exposed.

The nest openings in a nest have generally been described as being uniform. That is, all the nest openings in a single nest have been described as being of substantially the same shape. However, in one embodiment, the nest openings in a single nest may not all be of substantially the same shape. For example, some nest openings may be polygonal in shape, while other nest openings may be circular in shape. A nest with a nest openings which are of a variety of different shapes may be particularly suitable for use with a substrate which includes integrated circuit chips that have a variety of different ball grid array footprints.

It should be appreciated that although nest openings have been described as having polygonal, e.g., rectangular, and circular shapes, nest openings may generally have any shape that is suitable for accommodating ball grid arrays without departing from the spirit or the scope of the present invention. By way of example, in the event that a ball grid array has an irregular shape, the corresponding nest opening may also have substantially the same irregular shape. Such irregular shapes may include, but are not limited to, irregular polygonal shapes and assorted curved shapes.

As described above, nests are arranged to hold substrates which are substantially rectangular in shape. It should be appreciated, however, that nests may generally be reconfigured to accommodate substrates of virtually any size and shape. Nests may take on an overall circular shape when the substrates which are to be held using nests are circular in shape. Alternatively, nests may take on a general polygonal shape when the substrates which are to be held are effectively polygonal in shape.

While nests may include channels, or steps, which are intended to prevent scrap material generated during dicing processes from freely "flying" around, nests may not necessarily include channels. In one embodiment, nests may include clamping mechanism which hold scrap in place. Alternatively, in another embodiment, scrap material may not be constrained from moving after the dicing process if it is determined that substantially loose scrap material is not detrimental to the overall fabrication process.

Further, substrates which are retained in a nest may include any number of integrated circuit chips without departing from the spirit or the scope of the present invention. The number of chips depends both on the size of the chips and the size of the overall substrate. In one embodiment, a substrate which is approximately 8 inches by 2.5 inches may include 189 chips, each with a seven by seven ball grid array, in a twenty-seven by seven overall array. It should be appreciated, however, that the size of substrates and chips on the substrate may vary widely.

Nests have been described as being formed from aluminum or, more generally, metal. Typically, however, nests may be formed from any suitable material. For example, a nest may be formed from plastic. A plastic nest is likely to be lighter than a metal nest of the same size and shape and, as a result, may be preferable when the weight of the nest is an issue.

The steps associated with dicing a substrate that is held by a nest may generally be widely varied. Steps may be altered, added, or removed without departing from the spirit or the scope of the present invention. By way of example, a substrate may be loaded into a nest, which is then placed into a magazine of loaded nests that are placed one at a time onto a vacuum chuck. In other words, loaded nests may be queued prior to loading each nest onto a vacuum chuck. Also, in one embodiment, a covered nest fixture may be uncovered prior to removing the covered nest fixture from a wash and dry unit.

While the use of a nest has been described with respect to a substantially automatic dicing process, it should be appreciated that the nest may also be used in semi-automatic dicing processes. For instance, the nest may be used in a dicing process which requires manually loading the nest onto a vacuum chuck. The nest may also be used in a dicing process which requires that the nest is manually moved from a vacuum chuck to a wash and dry unit.

As described above, a substrate is placed in a nest such that the BGA side of the substrate faces into the nest. In other words, the "non-smooth" side of the substrate is effectively placed into the nest, and comes into substantially direct contact with a vacuum during a dicing process. However, in some cases, a substrate may be placed into a nest such that the "smooth," e.g., non-BGA or die, side faces into the nest. In such cases, the substrate may be cut from the non-smooth side. Therefore, the present examples are to be considered as illustrative and not restrictive, and the invention is not to be limited to the details given herein, but may be modified within the scope of the appended claims.

What is claimed is:

1. A nest apparatus arranged to support a substrate during a dicing process, the substrate including a chip, the substrate having a first side and a second side, wherein the second side of the substrate includes at least one contact associated with the chip, the nest apparatus comprising:
   at least one alignment mechanism, the alignment mechanism being arranged to position the substrate with respect to the nest apparatus; and
   a grid arrangement which defines at least one opening that is arranged to receive the at least one contact.

2. A nest apparatus as recited in claim 1 wherein the at least one alignment mechanism is an alignment pin, the alignment pin being arranged to engage the substrate to hold the substrate with respect to the nest apparatus.

3. A nest apparatus as recited in claim 1 wherein the at least one opening defined by the grid arrangement is substantially rectangularly shaped.

4. A nest apparatus as recited in claim 1 further including:
   at least one holding mechanism, the holding mechanism being arranged to substantially secure the nest apparatus to a dicing apparatus.

5. A nest apparatus as recited in claim 4 wherein the holding mechanism that is arranged to substantially secure the nest apparatus to the dicing apparatus is arranged to substantially secure the nest apparatus to a vacuum chuck associated with the dicing apparatus.

6. A nest apparatus as recited in claim 1 wherein the second side of the substrate includes a ball grid array, the contact being a part of the ball grid array, the opening defined by the grid arrangement being arranged to receive the ball grid array.

7. A nest apparatus as recited in claim 6 wherein the grid arrangement is arranged to inhibit translational movement of the chip after the dicing process.

8. A nest apparatus as recited in claim 7 wherein the grid arrangement is arranged to inhibit rotational movement of the chip after the dicing process.

9. A nest apparatus as recited in claim 1 further including:
   a channel arrangement, the channel arrangement being arranged to receive scrap material created from the substrate by the dicing process, the channel arrangement further being arranged to substantially reduce movement of the scrap material.

10. A cutting apparatus for a tapeless substrate, comprising:
    a nest mechanism for retaining said tapeless substrate not having a tape for adhesion;
    a cutting mechanism for said tapeless substrate; and
    a supply mechanism for supplying and setting said nest apparatus to said cutting mechanism for said tapeless substrate,
    wherein said cutting mechanism for said tapeless substrate includes a vacuum chuck for engaging said tapeless substrate retained within said nest mechanism with a vacuum, and a cutting saw for cutting a prescribed portion of said tapeless substrate retained within said nest mechanism and engaged with the vacuum.

11. A nest apparatus arranged to support a substrate during and after a dicing process, the substrate including a chip, the substrate having a first side and a second side, wherein the second side of the substrate includes at least one ball grid array associated with the chip, the at least one ball grid array including a first ball, the nest apparatus comprising:
    a positioning arrangement for positioning the substrate with respect to the nest apparatus; and
    a grid arrangement, the grid arrangement including a first wall, the grid arrangement being arranged to define an opening that is arranged to receive at least part of the at least one ball grid array, the opening being at least partially defined by the first wall, wherein the grid arrangement is further arranged to maintain a contact point between the first ball and the first wall.

12. A nest apparatus according to claim 11, wherein the contact point between the first ball and the first wall is arranged to inhibit translational movement of the chip after the dicing process.

13. A nest apparatus according to claim 12 wherein the contact point between the first ball and the first wall is further arranged to inhibit rotational movement of the chip after the dicing process.

14. A nest apparatus according to claim 11 wherein the positioning arrangement includes at least one alignment mechanism, the alignment mechanism being arranged to engage the substrate.

15. A nest apparatus according to claim 11 wherein the mounting mechanism is arranged to mount the nest apparatus to a vacuum chuck of the dicing saw assembly such that a vacuum engages the substrate through the opening defined by the grid arrangement.

16. A nest apparatus according to claim 11 further including a channel arrangement, the channel arrangement being arranged to receive scrap material created from the substrate by the dicing process, the channel arrangement further being arranged to substantially reduce movement of the scrap material.

17. A nest apparatus according to claim 11 wherein the first ball includes a side surface, and the contact point between the first ball and the first wall is maintained between the side surface and the first wall.

18. A single-piece nest apparatus arranged to support a substrate during and after a dicing process, the substrate including a chip, the substrate having a first side and a second side, the single-piece nest apparatus comprising:

a grid arrangement that defines an opening;

an alignment mechanism that is arranged to position the first side of the substrate at least partially over the grid arrangement and to cause the first side of the substrate to at least partially contact the grid arrangement, the alignment mechanism being arranged to position the chip over the opening substantially without contacting the second side of the substrate, the grid arrangement being arranged to inhibit both translational and rotational movement of the chip after the dicing process, wherein the single-piece nest apparatus is arranged to cooperate with a vacuum generated by a vacuum chuck to hold the substrate in position with respect to the grid arrangement during the dicing process.

19. A single-piece nest apparatus according to claim 18 wherein the alignment mechanism is an alignment pin, and wherein the single-piece nest apparatus and the vacuum are arranged to hold the substrate in position without the use of any other mechanism.

20. A nest apparatus arranged to support a substrate during and after a dicing process, the substrate including an integrated circuit chip, the substrate having a first side and a second side, wherein the second side of the substrate includes at least one ball grid array associated with the integrated circuit chip, the at least one ball grid array including a first ball having a surface, the nest apparatus comprising:

a grid arrangement, the grid arrangement including first and second walls, the grid arrangement being arranged to define an opening that is arranged to receive the at least one ball grid array, the opening being at least partially defined by the first wall and the second wall, wherein the first wall and the second wall are arranged to contact the surface of the first ball to substantially position the integrated circuit chip with respect to the opening.

21. A nest apparatus according to claim 20 wherein the at least one ball grid array further includes a second ball and the is arranged to receive the first ball and the second ball.

22. A cutting apparatus for cutting a tapeless substrate, the tapeless substrate including a chip, the chip having a first ball contact, the cutting apparatus comprising:

a nest mechanism for retaining the tapeless substrate not having a tape for adhesion, the nest mechanism including a grid arrangement, the grid arrangement including a first wall, the grid arrangement being arranged to define an opening that is arranged to receive the first ball contact, the opening being at least partially defined by the first wall, wherein the grid arrangement is further arranged to maintain a contact point between the first ball contact and the first wall to retain the first ball contact within the opening;

a cutting mechanism for cutting the tapeless substrate; and a supply mechanism for supplying the nest mechanism to the cutting mechanism, wherein the cutting mechanism for the tapeless substrate includes a vacuum chuck for engaging the tapeless substrate retained within the nest mechanism with a vacuum and a cutting saw for cutting the chip included in the tapeless substrate.

* * * * *